(12) United States Patent
Williams et al.

(10) Patent No.: US 6,455,872 B1
(45) Date of Patent: Sep. 24, 2002

(54) PHOTO-DETECTOR

(75) Inventors: David Arfon Williams, Cambridge; Albert Herble, Fen Causeway; Jeremy Allam, Cambridge, all of (GB)

(73) Assignee: Hitachi, Ltd., Tokyo (JP)

( * ) Notice: Subject to any disclaimer, the term of this patent is extended or adjusted under 35 U.S.C. 154(b) by 170 days.

(21) Appl. No.: 09/637,997

(22) Filed: Aug. 15, 2000

(30) Foreign Application Priority Data

Aug. 19, 1999 (EP) .............................................. 99306531

(51) Int. Cl.[7] ........................ H01L 29/06; H01L 31/072; H01L 31/109; H01L 31/0328; H01L 31/0336
(52) U.S. Cl. ........................................... 257/14; 257/24
(58) Field of Search .................... 257/21, 291

(56) References Cited

U.S. PATENT DOCUMENTS 6,369,404 B1 * 4/2002 Kane ........................... 257/14

OTHER PUBLICATIONS

Patent Abstracts of Japan, vol. 007, No. 253, Nov. 10, 1983 & JP 58 135922 A (Sanyo Denki KK), Aug. 12, 1983.
Cleland A N: Very Low Noise Photodetector Based on the Single Electron Transistor, Applied Physics Letters, US, vol. 61, No. 23, Dec. 7, 1992, pp. 2820–2822.
Hergenrother J M et al.: The single–Electron Transistor as an Ultrasensitive Microwave Detector; 1994, Applied Superconductivityu Conference, Boston, MA, USA, 16–21 Oct. 1994, vol. 5, No. 2, PT. 3, pp. 2604–2607.
Shuang L et al.: Silicon Single–Electron quantum–Dot Transistor Switch Operating at Room Temperature, Applied Physics Letters, US, Institute of Physics, New York, vol. 72, No. 10, Mar. 9, pp. 1205–1207.
Haroon, Ahmed: Single Electron Electronics: Challenge for Nanofrabrication, University of Cambridge, UK, J. Vac. Sci, Technol. B 15(6), Nov./Dec. 1997, pp. 2101–2108.
Nature, vol. 390, Nov. 13, 1997, J.S. Foresi et al.: Photonic–bandgap microcavities in optical waveguides.

* cited by examiner

Primary Examiner—Tom Thomas
Assistant Examiner—Samuel Admassu Gebremariam
(74) Attorney, Agent, or Firm—Kenyon & Kenyon

(57) ABSTRACT

A photo-detector comprises a photo-absorptive region (1) which absorbs individual incident photons to produce corresponding electron-hole pairs. A bias ($V_b$) applied by an electrode (3) to the region 1 separates the oppositely charged electrons and holes such that the individual electrons apply a gate field to an electrometer (4) in the form of a single electron transistor which has a source-drain path (6) along which carrier charged transport is limited Coulomb blockade. The charge of the individual, photo-induced electrons (e) modulate charge carrier transport through the single electron transistor and the resulting current is detected by amplifier (A1) to produce an voltage output ($V_{out}$) so as to detect incident photons individually.

24 Claims, 11 Drawing Sheets ity as a photodetector.
PHOTO-DETECTOR

FIELD OF THE INVENTION

This invention relates to a photo-detector.

BACKGROUND

Many technologies used for communications and information processing require light-detection elements. In some applications, the sensitivity of the detector is of paramount importance. For example in quantum cryptography for secure communications, detection of single photons is required as part of the cryptographic process. Currently, photomultipliers and avalanche photodiodes are used for detection in such systems but have intrinsic disadvantages. Photomultipliers are mechanically delicate, bulky, use high voltages and are prone to overload problems. They have a low quantum efficiency. Avalanche photodiodes are noisy, use high gain voltages and have high dark counts.

A photodetector based on a single electron transistor has been proposed in "Very low noise photodetector based on the single electron transistor" A. N. Cleland et al Appl. Phys. Lett. 61(23) Dec. 7, 1992 pp2820–2822. The device operated with low noise levels but a number of problems remain outstanding. Spurious currents can arise produced by charge carrier sources other than incident photons, which degrade the output of the device. Also, its sensitivity is temperature dependent. In practice, the experimental device needs to be cooled in a dilution refrigerator, which renders it bulky and limits its practicality as a photodetector.

The present invention seeks to provide an improved, photo-detector capable of detecting individual photons.

SUMMARY OF THE INVENTION

According to a first aspect of the invention there is provided photo-detector comprising a photo-absorptive region to absorb incident photons and produce charge carriers of opposite polarity in response thereto, first and second electrometers responsive to individual ones of the charge carriers of opposite polarity respectively to provide corresponding electrical outputs, and a comparator responsive to the outputs of the electrometers to provide an electrical detector output corresponding to the incident photons.

By using first and second electrometers, their outputs can be combined to increase sensitivity of the photodetector according to the invention to incident photons and spurious currents produced in the electrometers by other sources can be arranged to cancel one another to reduce spurious outputs from the device.

In another aspect the invention provides a photo-detector comprising a photo-absorptive region to absorb incident photons and produce charge carriers in response thereto, an electrometer responsive to individual ones of the charge carriers to provide a corresponding electrical output, and an electrically driven cooling device to cool the electrometer.

The cooling device may comprise a Peltier effect device.

In a further aspect the invention provides a photo-detector comprising a photo-absorptive region to absorb incident photons and produce charge carriers in response thereto, and an electrometer responsive to individual ones of the charge carriers to provide a corresponding electrical output and a substrate that has a main body portion and a cantilever extending from the main body portion, said photo-absorptive region and said electrometer being disposed in the cantilever. The cantilevered structure facilitates arrays of the devices to be formed on a substrate.

BRIEF DESCRIPTION OF THE DRAWINGS

In order that the invention may be more fully understood embodiments thereof will now be described by way of example with reference to the accompanying drawings in which.

DETAILED DESCRIPTION

Figure 1:
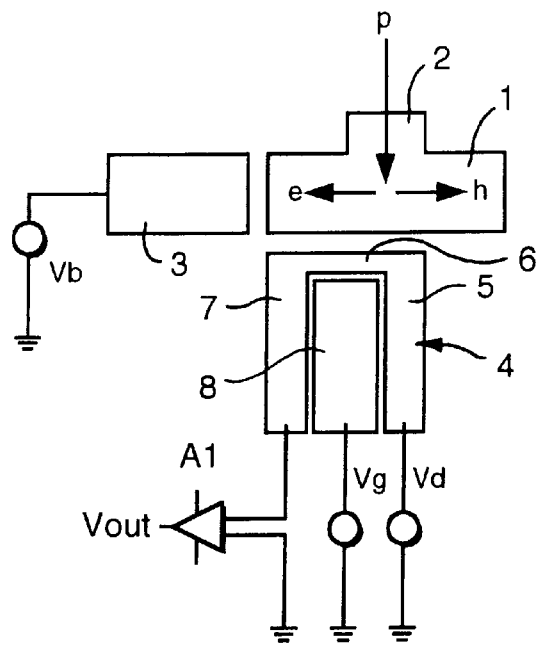
FIG. 1 is a schematic plan view of a photo-detector using a single electron transistor.

FIG. 1 illustrates the basic principles of operation of a photo-detector using a single electron transistor. The photo-detector may be constructed on a semiconductor chip as will be explained in more detail hereinafter. The device includes a photo-absorptive region 1 which has an input region 2 to receive photons which may for example be fed into region 1 through a waveguide (not shown) integrated onto the substrate. Photons p received in the absorptive region 1 produce electron-hole pairs e, h. These oppositely charge carriers are separated from one another by an electrostatic field applied to the region 1 by means of an electrode 3 which receives a bias voltage $V_b$.

The charge of the individually produced electrons is detected by means of an electrometer 4 in the form of a single electron transistor (SET).

Figure 2:
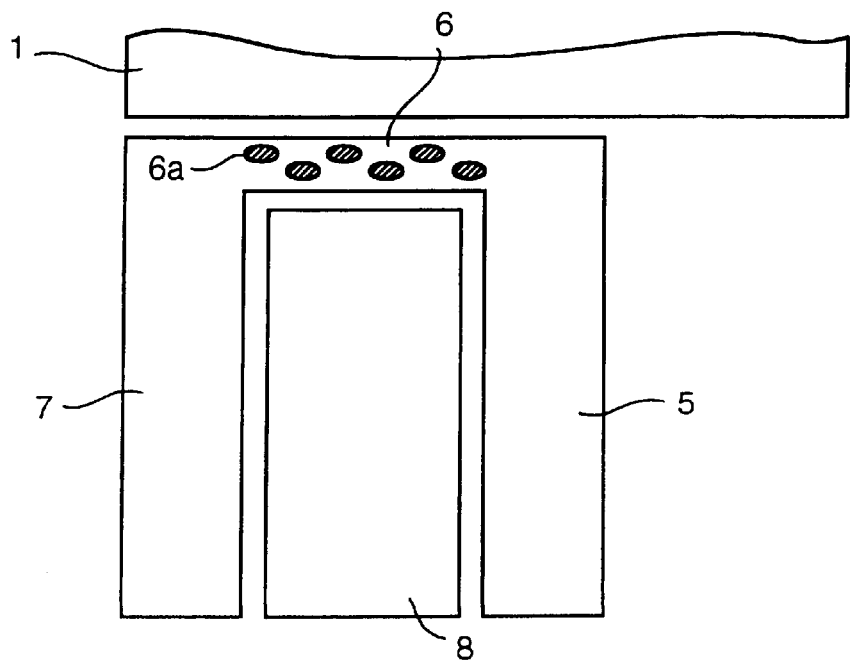
FIG. 2 is an enlarged view of a portion of the single electron transistor shown in FIG. 1.

SETs are well known and have been fabricated in a number of different materials and a general review is given in "Single electron electronics: Challenge for nanofabrication" H. Ahmed, J. Vac .Sci. Technol.B 15(6) Nov/Dec 1997 pp 2101–2108. In this example, the conductors of the SET are formed of intrinsic polysilicon in a manner described with reference to FIG. 9 of Ahmed, supra, p2105. The structure of the SET is shown in more detail in FIG. 2. The transistor comprises an intrinsic silicon conductive path which defines a drain electrode region 5, a source-drain path 6 and a source electrode 7. The source-drain path 6 is subject to a field applied by means of an gate electrode 8. As described by Ahmed supra, the relatively narrow source-drain path 6, due to donor impurities, behaves as series of conductive islands that are insulated from each other, so as to provide a multiple tunnel junction configuration. Charge carrier transport along the source-drain path is subject to the Coulomb blockade effect with the result that single electron transport occurs along the source-drain path 6. It will be understood that the SET can alternatively work with holes rather than electrons.

Figure 3:
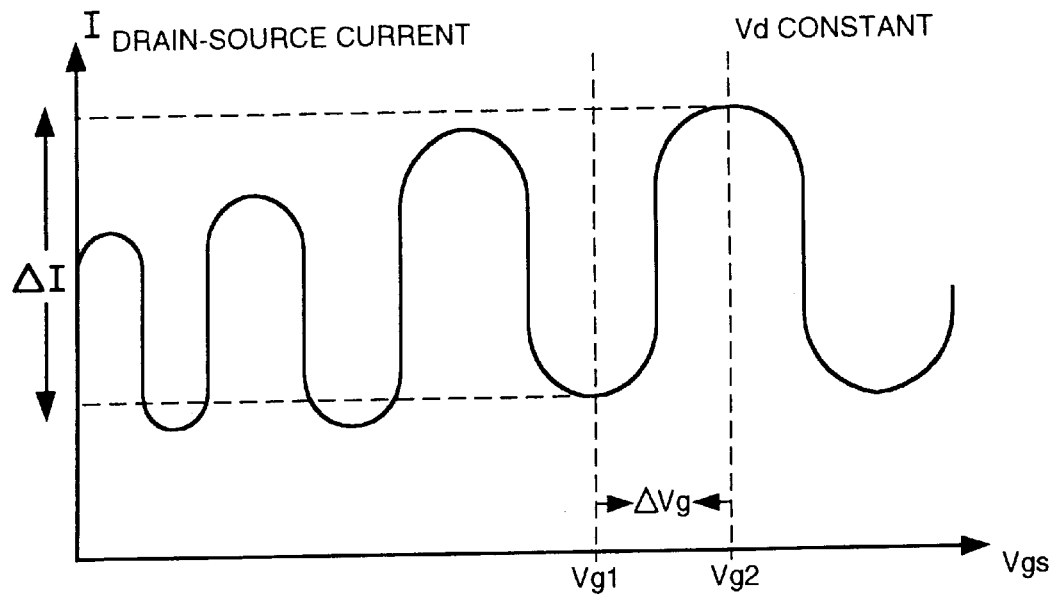
FIG. 3 is a graph of the drain-source current versus gate voltage for the single electron transistor.

The conduction characteristics of the SET are illustrated by the graph of FIG. 3. As the gate-source voltage $V_{gs}$ is increased, the drain-source current I, which is of the order of nanoamps, oscillates between relatively high and low values due to the effect of Coulomb blockade. Thus, referring to FIG. 3, when the gate voltage $V_{gs}$ is increased from $V_{g1}$, to $V_{g2}$ i.e. by $\Delta V_g$, the drain-source current I increases rapidly by an amount $\Delta I$. This can be used to detect the individual electrons produced by corresponding incident photons in photo-absorptive region 1, as will now be explained.

Referring to FIG. 1, the electrometer 4 is configured adjacent to the photo-responsive region 1 and is subject to a drain bias $V_d$ applied to the drain electrode 5. The source electrode 7 is connected to an amplifier A1 which provides the voltage output $V_{out}$. A fixed gate bias $V_g$ is applied to the gate electrode 8.

When the photon p is incident on the photo-absorptive region 1, it produces the corresponding electron-hole pair e, h. These oppositely charged carriers are separated by the bias field produced by voltage $V_b$ applied to electrode 3. The field produced by the individual electron e changes the gate field applied to the drain-source path 6 of the electrometer 4. Thus in effect, the gate voltage $V_g$ is altered by virtue of the presence of the electron e by the value $\Delta V_g$ shown in FIG. 3, with the result that the current through the source drain path increases by an amount $\Delta I$. The effect occurs for the lifetime of the electron-hole pair e, h and thereafter, the current decreases by the value $\Delta I$. Thus, the photo-induced electron e produces a current pulse $\Delta I$ on the source electrode 7. This pulse is amplified by amplifier A1 to provide an output pulse at the amplifier output $V_{out}$.

SETs can operate at room temperature as described in "Silicon single-electron quantum-dot transistor switch operating at room temperature" L. Zhuang et al, Appl. Phy. Lett. Vol. 70, No. 10 pp 1205–1207, March 1998. However, it may be preferable to cool the device structure in order to enhance the effect of Coulomb blockade to charge carrier transport in the source-drain path 6.

The device shown in FIG. 1 has the advantage that individual electrons produced by photo-absorption of individual photons can be detected without the need for avalanche or other photomultiplication techniques to achieve detection, thereby providing a simple and extremely sensitive photo-detector.

Figure 4:
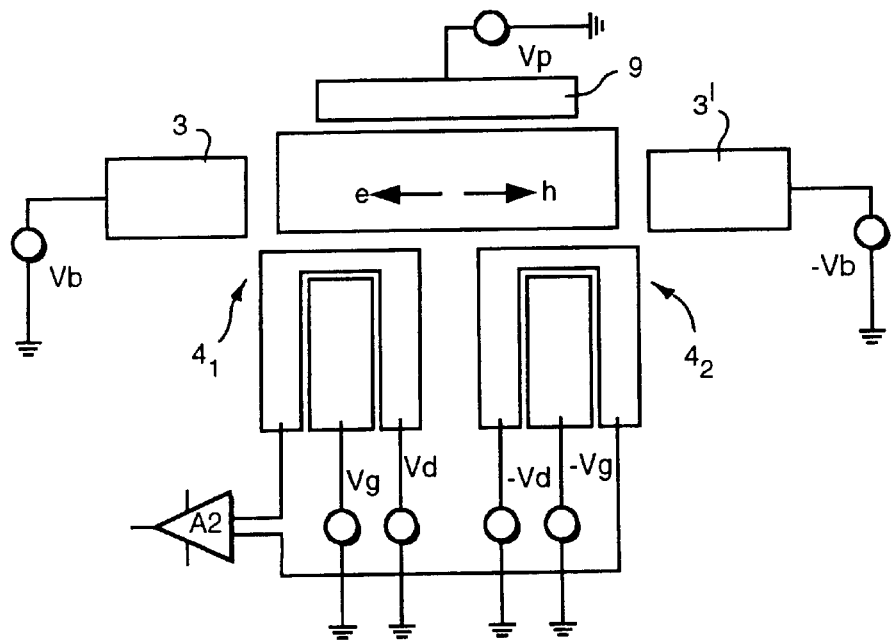
FIG. 4 is a schematic plan view of a photo-detector in accordance with the invention, which uses two single electron transistor electrometers.

FIG. 4 illustrates an embodiment of photo-detector according to the invention. Two electrometers $4_1$, $4_2$ are used in order to detect the oppositely charged electrons and holes produced by incident photons. In this example, photons are incident vertically downwardly into the photo-absorptive region 1 and the bias voltage $V_b$ is applied with opposite polarities to electrodes 3, 3' at opposite ends of the region 1. Thus, in use, the electrons and holes produced by photo-absorption migrate to opposite ends of the region 1 and are detected by the electrometers $4_1$, $4_2$ respectively. The source current of each electrometer 4 is fed to an individual input of a comparator amplifier A2. It will be understood that the source currents of the electrometers can be configured to be of opposite sign so as to be added by the comparator amplifier A2 to provide an output $V_{out}$. This arrangement has the advantage that noise due current and other fluctuations caused e.g. by temperature variation, have an equal effect in both of the electrometers and will be subtracted from one another in the comparator A2 thereby reducing electrical noise and non-linearities in the output voltage $V_{out}$. Also, the threshold of the amplifier A2 can be set so that it only provides an output when both of the electrometers $4_1$, $4_2$ produce an output, indicating the presence of both an electron an hole from an incident photon, thereby improving the reliability of detection of a photon event, so as to exclude detection of spurious currents which occur in one of the electrometers only.

A further electrode 9 is provided which can be supplied with a purging voltage $V_p$ so as to apply a field to the photo-absorptive region 1 periodically in order to force free electrons and holes to recombine in order to re-set the device. Alternatively, the purging can be carried out by turning off the bias voltage applied between the electrodes 3–3' or by applying a reverse bias to them.

Figure 5:
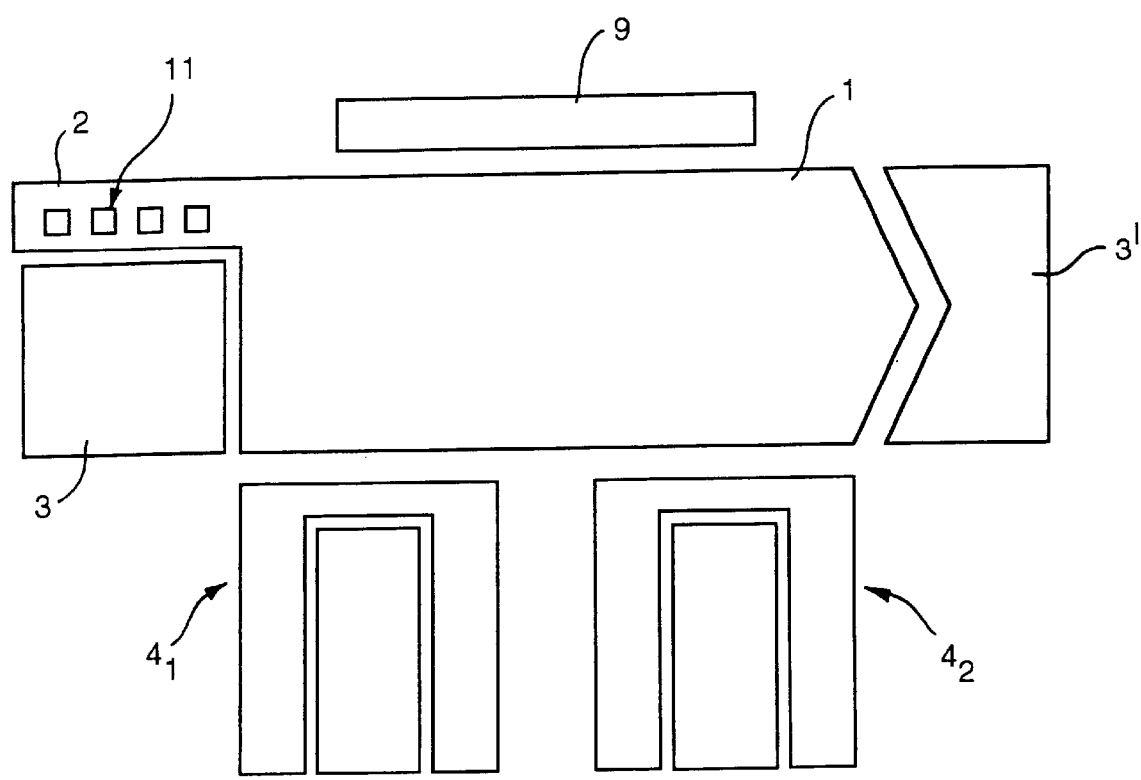
FIG. 5 is a schematic plan view of a further embodiment of photo-detector in accordance with the invention.

Another example of photo-detector is shown in FIG. 5 in plan view, in which photons are incident through an integral semiconductor waveguide 2. The photo-absorptive region 1 is configured with side walls of a shape to inhibit retro-reflection of photons back into the input waveguide 2.

A photonic-bandgap microcavity formed by a series of holes 11 may be provided in the input waveguide 2 in order to tune the photo-detector, e.g. to a wavelength used in optical communications, such as 1.54 $\mu$m. The photonic-gap microcavity may be fabricated as described in "Photonic-bandgap microcavities in optical waveguides" J. S. Foresi et al, Nature Vol. 390, pp 143–144, November 1997. Alternatively, a Bragg grating structure may be etched into the input waveguide 2.

The described examples of the photo-detector can be manufactured using conventional semiconductor fabrication techniques. The material chosen for the photo-absorptive region 1 should be of very high quality, undoped and with a very low defect density so as to reduce the density of recombination centres.

In practice, charge may become undesirably trapped in the photo-absorptive region 1 and compensation for the charge can be carried out in the single electrometer embodiment of FIG. 1, by adjusting the bias voltages $V_g$ and/or $V_d$. Compensation for trapped charge automatically occurs in the comparator arrangement of electrometers shown in FIGS. 4 and 5.

The photo-absorptive region 1 is provided with an external coating layer (not shown) in order to prevent surface recombination of the electron-hole pairs produced by incident photons. Suitable choices of semiconductor-insulator materials are Si—$SiO_2$; GaAs—AlGaAs, InGaAs—InP and $FeSi_2$—$SiO_2$ for the 1.5 $\mu$m wavelength range.

Each electrometer can be made from the same materials as the photo-absorptive region 1 in order to simplify fabrication. However, for some applications, different materials could be used. For example, the electrometers 4 and associated circuitry could be made using silicon technology whilst the photon trap region 1 may be added using different materials, the choice depending on the wavelength of the photons to be detected.

Figure 6:
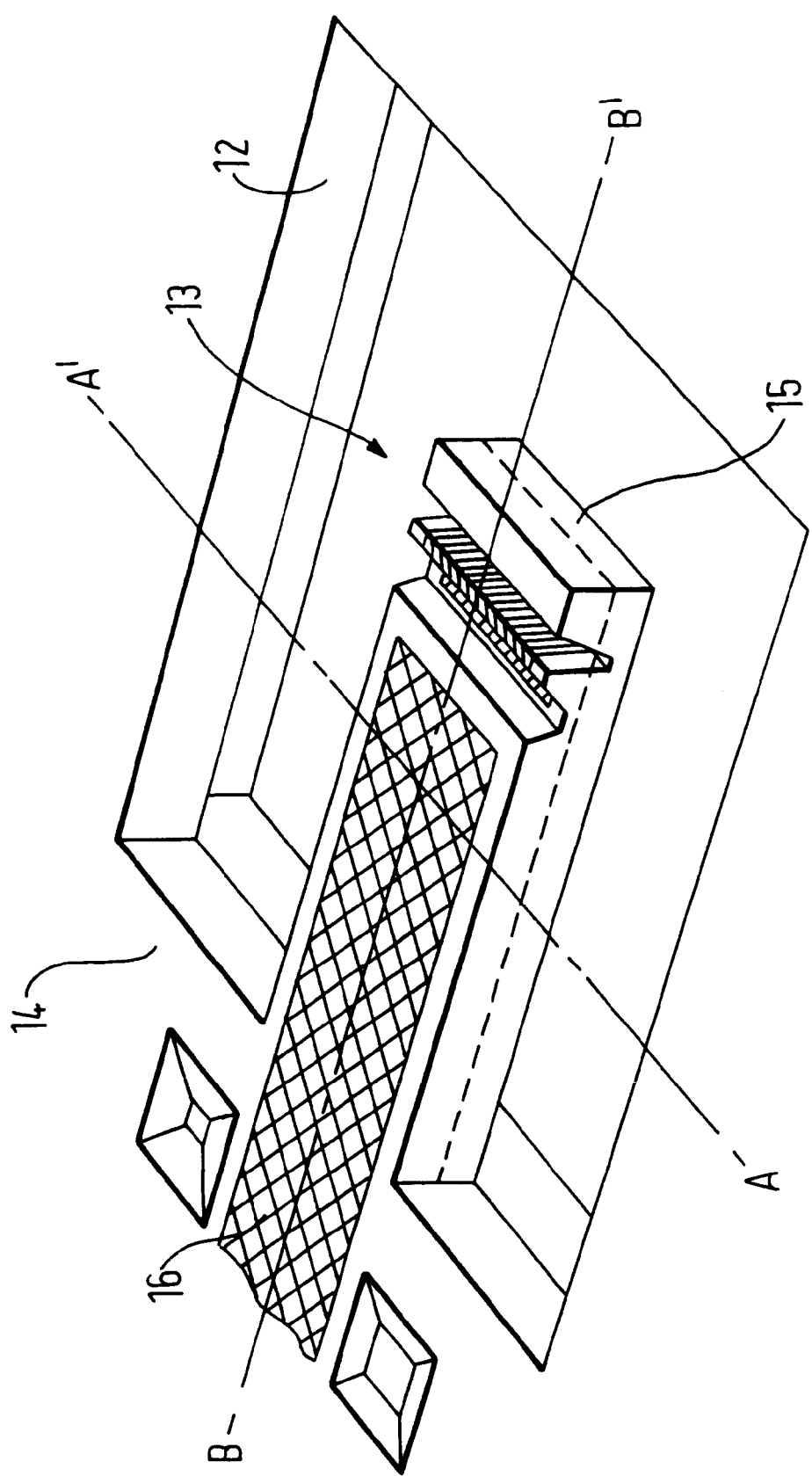
FIG. 6 is a schematic perspective view of a practical implementation of photodetector in accordance with the invention.

A more practical example of photo-detector according to the invention will now be described with reference to FIGS. 6 to 8. Referring to FIG. 6, the photo device is formed on a cantilever. As will be explained in more detail later, a region of layer structure 12 is etched to form a trench 13, so as to provide a main portion 14 of the substrate and a cantilever 15 that extends into the trench 13. The photo-detector device according to the invention is formed in the cantilever 15 and makes connection to further circuit components (not shown) formed in the surface of the main body portion 14. The area occupied by the photo-detector is shown by hatched region 16. In a typical example the cantilever is of length 2–10 $\mu$m and width 50 nm–1 $\mu$m.

Figure 7:
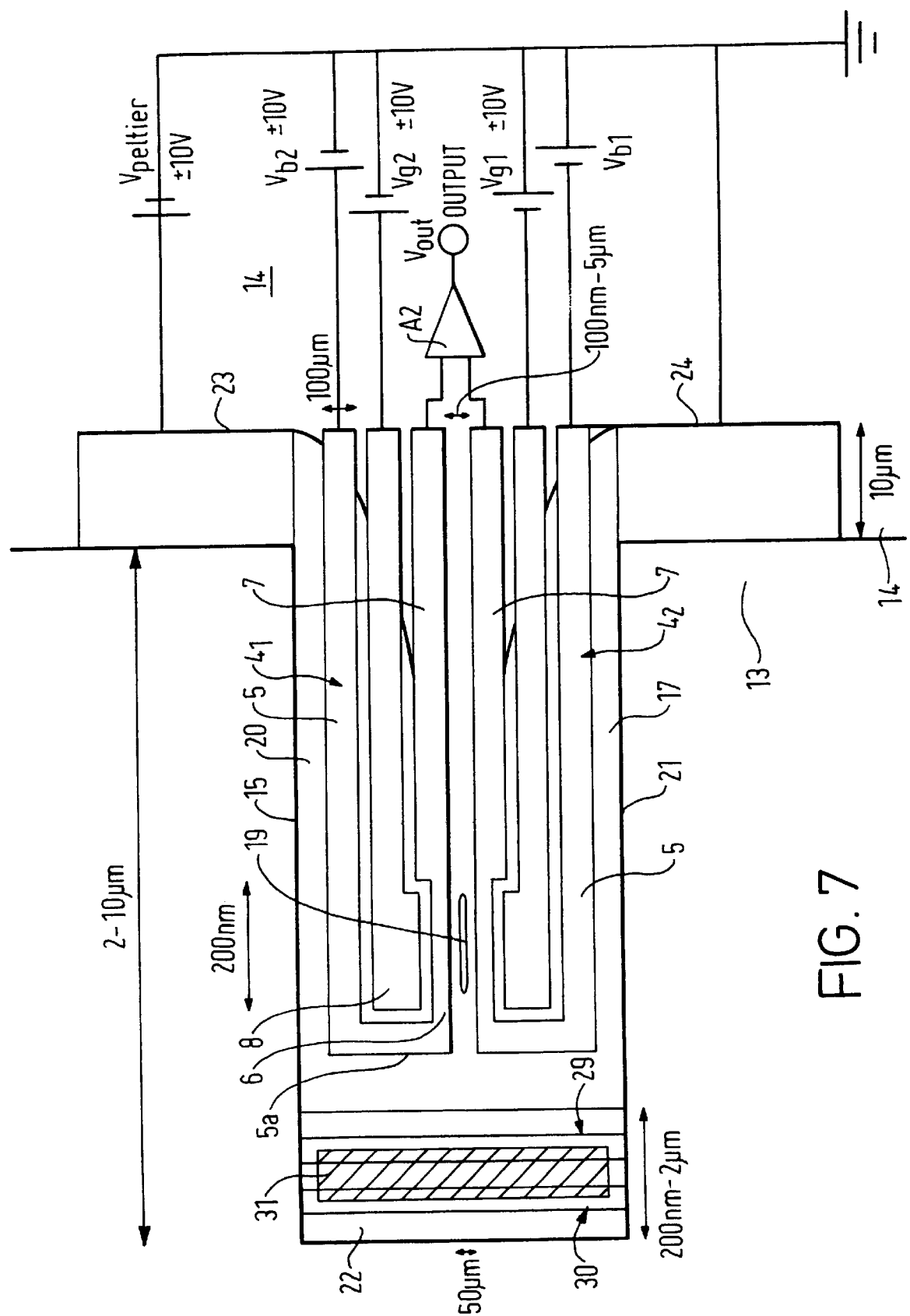
FIG. 7 is a schematic plan view of the device as shown in FIG. 6.
Figure 8:
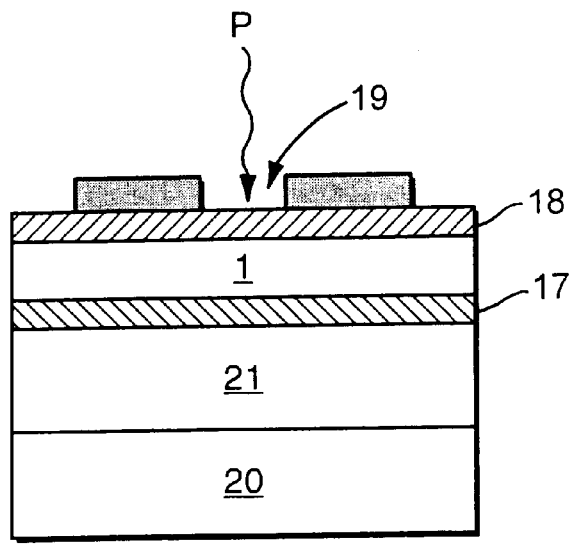
FIG. 8 is a schematic sectional view of the cantilever shown in FIG. 7, taken along the line X—X'.

The general circuit configuration is similar to that shown in FIG. 4 and is illustrated in more detail in the plan view of the cantilever 15 shown in FIG. 7 and the sectional view of the cantilever illustrated in FIG. 8.

As can be clearly seen in FIG. 8, the photo-absorptive region 1 comprises a layer of intrinsic semiconductor e.g. intrinsic Si, of thickness 0.1–5 µm, underlaid by an insulating $Si_3N_4$ layer 17 of thickness 0.1 µm and overlaid by a similar nitride layer 18 of thickness of the order of 0.1 µm. In use, photons p are incident of the cantilever 15 from above as shown in FIG. 8, and pass into the photo-absorptive region 1 to generate electrons and holes. The device is responsive to incident electrons in a region 19.

The electrometers $4_1$, $4_2$, are used not only to detect electrons and holes but also to apply the bias field $V_b$ which causes their separation. The detailed structure of the electrometer $4_1$, which detects electrons, will now be described and it will be understood that the electrometer $4_2$ is of a similar construction. The electrometer $4_1$ comprises conductive polycrystalline silicon (hereafter referred to as "polysilicon" or poly-Si) tracks formed on the insulating nitride laye are 50 nm thick and their fabrication will be described later. The polysilicon tracks of the electrometer define a drain electrode 5 extending longitudinally of the cantilever with a re-entrant part 5a that connects onto region 6 of reduced width that forms the drain-source path. The strip 5, 5a is of a width of the order of 100 nm whereas the width of path 6 is of the order of 2 nm. Source electrode portion 7 of width 100 nm extends along the cantilever from the source-drain path 6 back to the main body portion 14. The source-drain path 6 is of a length of the order of 200 nm and is coextensive with the region 19 that is sensitive to incident photons. Gate electrode 8 applies gate voltage to the source-drain path 6 in order to produce conditions of Coulomb blockade as previously described.

The electrometer $4_2$ for detecting holes, is of similar construction. The source electrode 7 of the two electrometers $4_1$, $4_2$ are connected as inputs to comparator amplifier A2 which provides output $V_{out}$.

The drain electrodes 5 of the two electrometers receive individual bias voltages $V_{b1}$, $V_{b2}$, so as to apply a bias field to the photo-absorptive region 1 which produces the aforementioned separation of electrons and holes produced by incident photons.

The cantilever 15 is also configured to include a Peltier device. As well known in the art, a cooling effect can be produced by passing a current through a junction between heavily doped p or n-type semiconductor region and a metal and in the embodiment of FIG. 7 this approach is used to cool the cantilever 15. The underside of the cantilever is provided with heavily doped p and n-type regions 20, 21 (FIG. 8) which extend longitudinally between an ohmic contact region 22 at the outermost end of the cantilever 15, to respective ohmic contact regions 23, 24 on the main body portion 14. In use, a voltage $V_p$ of 10 volts is applied between ohmic contacts 23, 24 so as to pass a current through the regions 20, 22, 21 and thereby produce a cooling effect in the cantilever 15.

A method of fabricating the device of FIGS. 6 to 8 will now be described with reference to FIGS. 9 and 10. FIG. 9 shows a sectional view of the cantilever 15 and main body portion 14 of the substrate along the line A–A' as shown in FIG. 6, while FIG. 10 shows the same structures in section along the line B–B'.

Figure 9A:
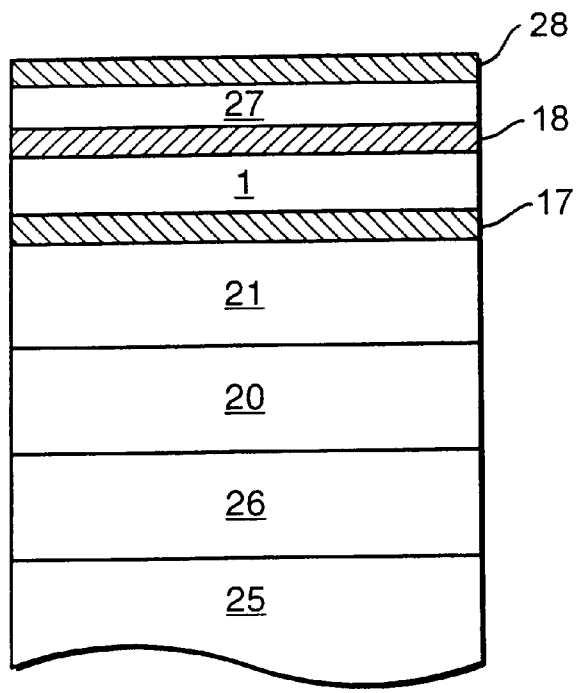
FIGS. 9a–e illustrates process steps for fabricating the cantilever shown in FIGS. 6, 7 and 8 along line A—A
Figure 10A:
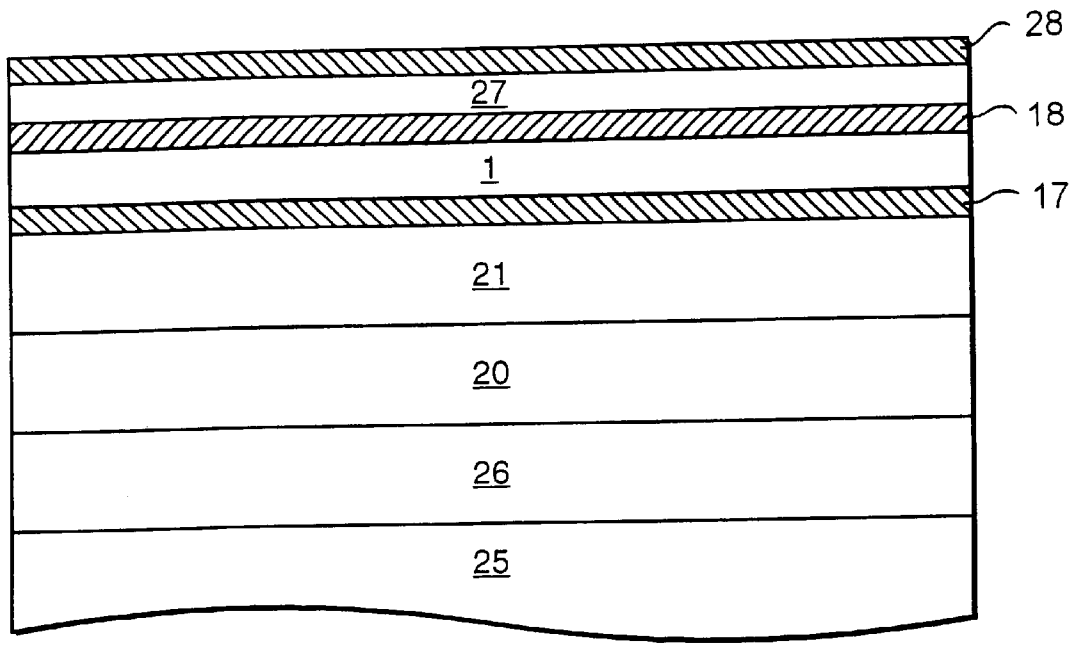
' and FIGS. 10a–f illustrates process steps for fabricating the cantilever shown in FIGS. 6, 7 and 8 along line B—B'.

Referring to FIGS. 9a and 10a, the semiconductor layer structure 12 comprises a substrate of single crystal of (100) silicon 25. On top of this substrate a number of layers are deposited or grown as follows. A 0.5 µm thick $SiO_2$ layer 26 is grown by wet oxidation at 1000° C. to serve as a sacrificial layer. The substrate 12 is then transferred to a reactor for low-pressure chemical vapour deposition (LPCVD) of the remaining layers.

First, the layers that make up the Peltier section of the device are grown. A 0.5 µm p-type poly-Si layer 20, doped with boron to a concentration of $1\times10^{19}cm^{-3}$, is grown using silane and diborane as feed gases. A 0.5 µm n-type poly-Si layer 21, doped with arsenic to a concentration of $1\times10^{19}cm^{-3}$, is grown using silane and arsine as feed gases.

Second, the photo-absortion section of the device is deposited. The $Si_3N_4$ layer 17 is grown to a thickness of 0.1 µm using silane and ammonia as feed gases. The undoped poly-Si layer 1 is grown to a thickness of 1 µm using silane diluted with hydrogen gas to serve as the photo-absorption layer 1. Next, $Si_3N_4$ layer 18 is grown to a thickness of a 0.1 µm using silane and ammonia. Thirdly, the electrometer section is grown. A 50 nm n-type poly-Si layer 27 is grown, doped with As to a concentration of $1\times10^{20}cm^{-3}$. Finally a protective 20 nm $Si_3N_4$ capping layer 28 is deposited using silane and ammonia.

It is noted that these deposited layers are used to fabricate the cantilever 15 and circuitry directly associated with the electrometer 4. Other layers may also be deposited to form ancillary circuits such as amplifiers and comparators.

Once the structure has been deposited, the device can be fabricated starting with the formation of the electrometers 4 and finishing with the creation of the cantilever 15.

Figure 9B:
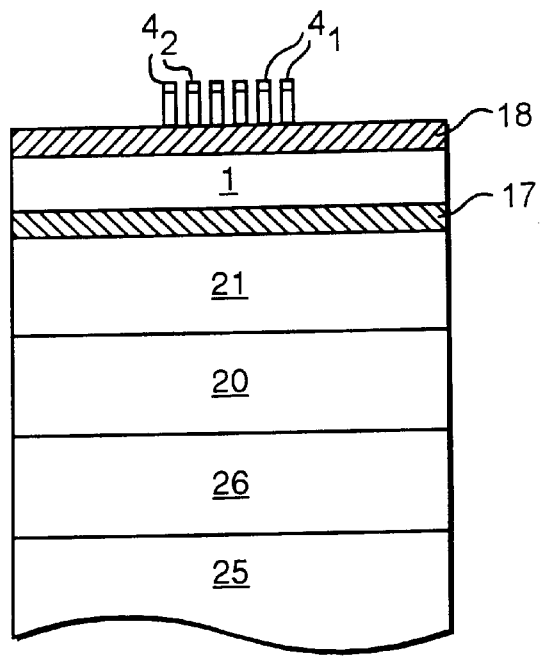
Figure 10B:
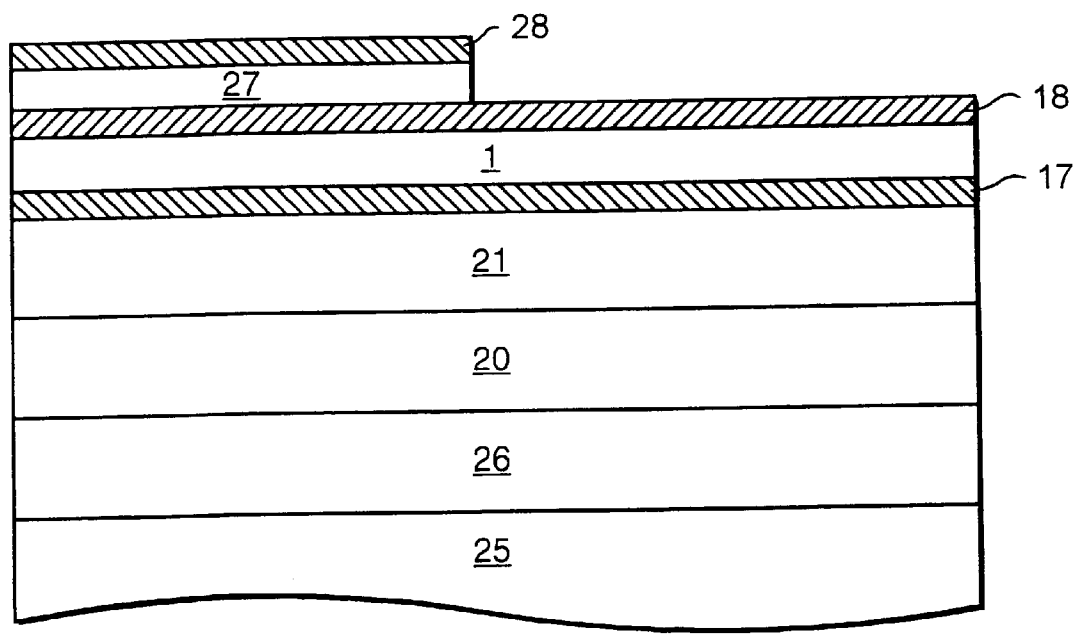

Referring to FIGS. 9b and 10b, the conductive electrodes 5, 6, 7 and 8 which make up the electrometers $4_1$, $4_2$, are formed by patterning poly-methyl-methacrylate (PMMA) resist that has been applied to the surface of the layer structure 12 and patterned using conventional electron-beam lithographic techniques. Thereafter, the capping $Si_3N_4$ layer 28 and the heavily doped polysilicon layer 27 that is unprotected by the resist is etched by $CF_4/O_2$ reactive ion etching.

Figure 10C:
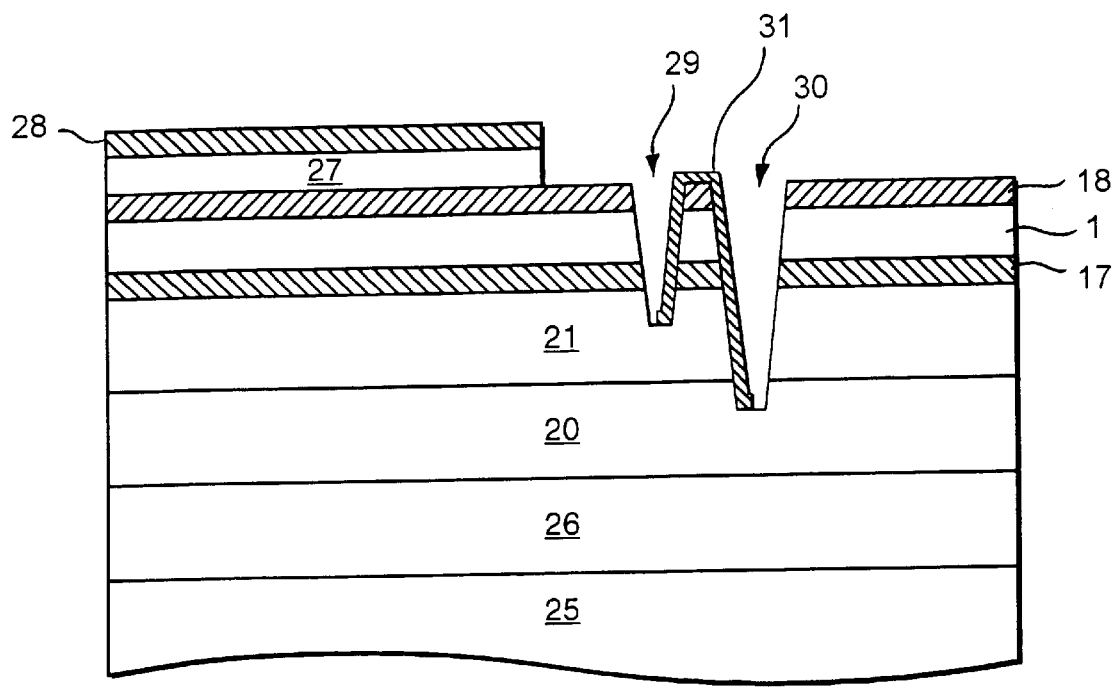

Referring to FIG. 10c, the ohmic contacts 22 to the heavily doped p- and n-type semiconductor regions 21, 22 for the Peltier device are defined. For the sake of clarity, a description of the fabrication of the ohmic contact regions 23, 24 on the main body portion 14 is not included. However, it will be understood by those skilled in the art that the following process steps can also be used to define the ohmic contact regions 23, 24 on the main body portion 14, as well as the ohmic contact 22 on the cantilever 15.

A rectangular window approximately the width of the intended cantilever 15 is defined using optical resist and a first via 29, with sloping side walls, is etched using $CF_4/O_2$ reactive ion etching. The etch is calibrated to stop within the heavily doped n-type poly-Si silicon region 21. The patterned resist is removed and fresh optical resist is applied and patterned in order to define another window of the same size and adjacent to the first via 29. A $CF_4/O_2$ reactive ion etching is used to etch deeper second via 30 that stops within the heavily doped p-type region 20. The patterned resist is removed and a fresh layer of optical resist is deposited and patterned to define a window, not so wide as the previous windows, but long enough to overlap with both first and second vias 29, 30. A 0.2 µm aluminium layer 31 is sputtered as an ohmic contact metal. The aluminium layer 31 is sputtered in such a way that it runs from the bottom of the first via 29 up the sloping side wall, over and down the sloping side wall into the bottom of the second via 30. Thus, the aluminium layer 31 serves to connect the heavily doped p- and n-type semiconductor regions 21, 22 for the Peltier device. The structure may be sintered at this time to improve the performance of the ohmic contact.

The remainder of the capping nitride layer 28 may be removed in hot phosphoric acid. Furthermore, a single anti-reflection coating comprising $TiO_2$ or $Ta_2O_5$ or a double anti-reflection coating comprising $TiO_2$ and $Al_2O_3$ may be deposited and patterned in the vicinity of the photo-absorption region 19.

Figure 9C:
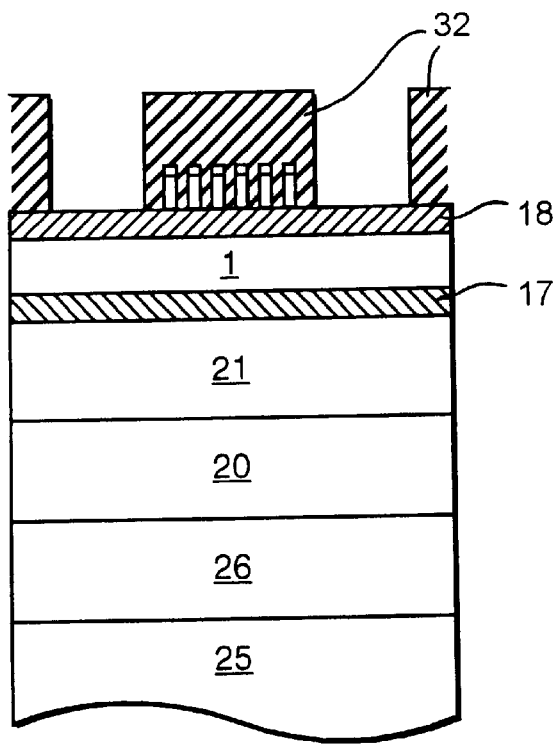
Figure 10D:
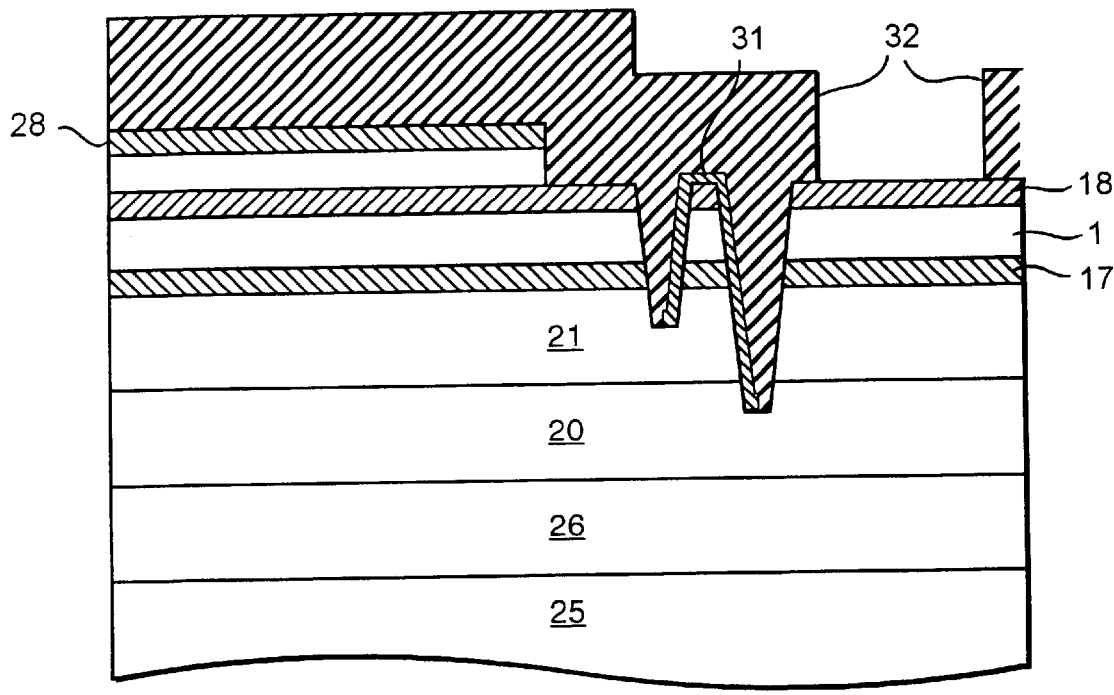

Then as shown in FIGS. 9c and 10d, a photolithographic mask layer 32 is defined over regions that are to form the cantilever 15 and main body portion 14.

Figure 9D:
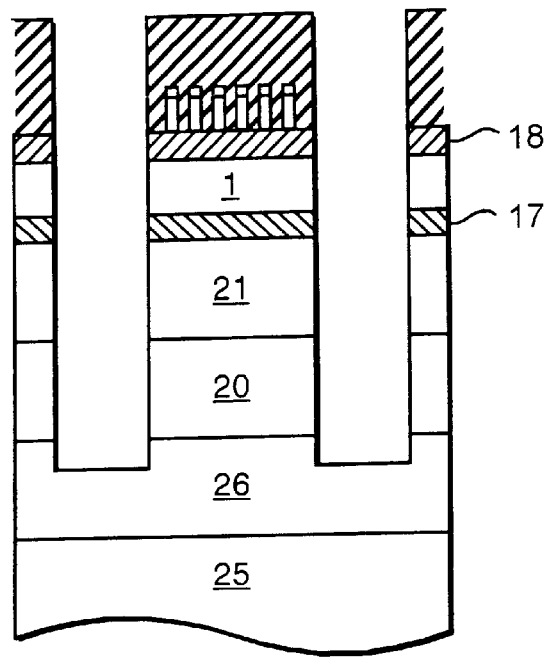
Figure 9E:
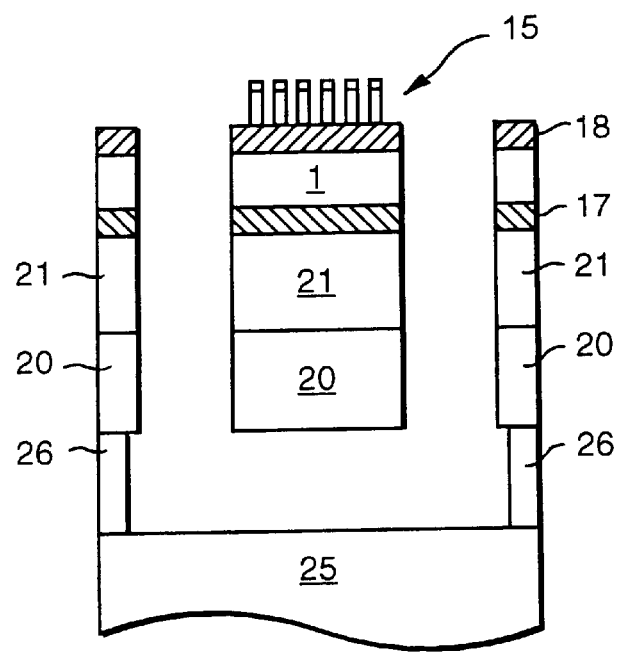
Figure 10E:
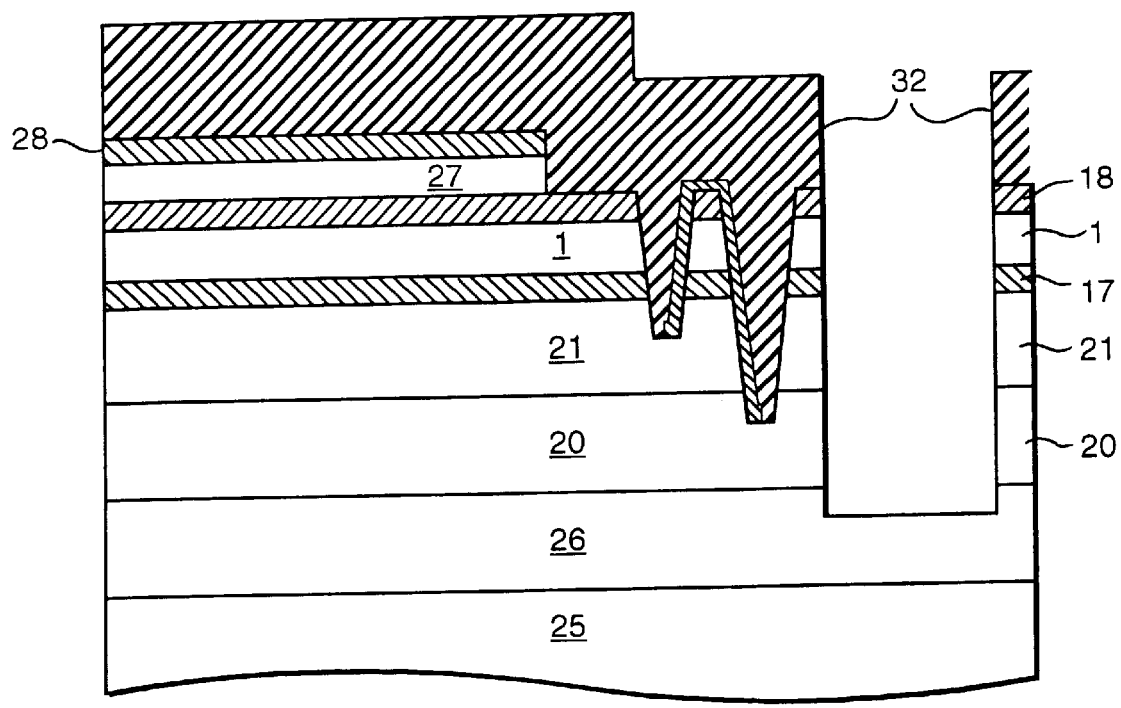
Figure 10F:
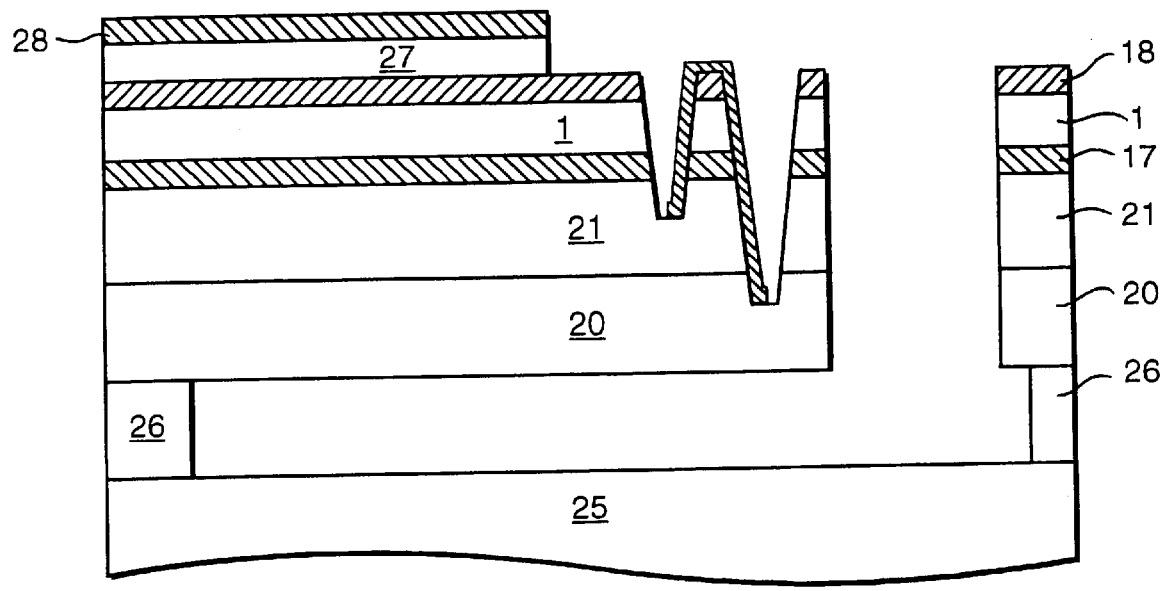

Thereafter, as shown in FIGS. 9d and 10e, a $CF_4/O_2$ reactive ion etch is used to anisotropically remove the heavily doped p- and n-type semiconductor regions 21, 22. The etch is calibrated to stop just within the upper portion of the sacrificial $SiO_2$ layer 26. Then, as shown in FIGS. 9e and 10d, the device is place in dilute (10%) hydroflouric acid (HF) and the sacrificial $SiO_2$ layer 26 is isotropically etched. The etch is calibrated to be enough to remove the sacrificial $SiO_2$ layer 26 from underneath the p-type layer 20 and thus leave the cantilever 15 unsupported along its length. It is noted that the etch-rate of $SiO_2$ in HF is about a hundred times that of $Si_3N_4$. After this final processing step, the cantilever 15 and the electrometers 4 are defined.

Conventional techniques may be used to form the differential amplifier A2 in the surface of the main body portion 14 of the substrate as a CMOS device.

The device is operable at room temperature to detect single photons. Suitable values for $V_g$, $V_{b1}$, $V_{b2}$ and $V_p$ are 0.5 to 20V, ±1.5V, ±1.5V and 2 to 10V respectively.

It will be understood that many modification and variations fall within the scope of the claimed invention. For example, arrays of photo-detectors according to the invention may be formed, which may be addressed in a manner similar to charge coupled devices so as to provide a two dimensional spatial image.

The formation of the Peltier device in the cantilever may be formed in different ways, for example with the layers 20, 21 being arranged side-by-side rather than in an overlying relationship. Also, in the embodiments of FIGS. 7 to 10, the ohmic connector 31 may be formed in a single via, rather than the two vias 29, 30.

As an alternative to silicon, the device may be fabricated from other semiconductor materials, in particular GaAs and AlGaAs. The electrometers 4 may be fabricated using 6-doped GaAs using Si as a donor with a sheet concentration of $1\times10^{13}cm^{-2}$. The photo-absorption layer 1 comprises a layer of intrinsic GaAs 1 μm thick. The Peltier device is fabricated from p- and n-type GaAs doped with Be and As respectively and each to a concentration of $1\times10^{18}cm^{-3}$. In this case the ohmic metallization may be Sn/Au. $Al_xGa_{1-x}As$, with aluminium fraction of x>0.3 may be used as an insulator. In order to define the cantilever, the use of a sacrificial layer is not needed. Instead, anisotropic wet etches may be used that etch different crystal planes at different rates. For example, a citric acid/ hydrogen peroxide/water system may be used to etch a GaAs wire and form a cantilever with a triangular cross-section. The GaAs/AlGaAs layers may be grown by molecular beam epitaxy and will form a single crystal heterostructure.

Furthermore, instead of using a single electrometer as described in relation to FIG. 1, with an amplifier A1, a charge storage node may be connected to the source electrode 7 so that successive photo-detection events cause the node to become successively charge such that the voltage developed at the charge storage node exhibits a staircase voltage with time as successive photons are detected.

Thus, the voltage on the charge storage node will be a function of the number of photons detected.

Also, such an array can be used as a photon memory device. The separate electron-hole pairs produced by incident photons may remain in the photo-absorptive region 1 for a relatively long time i.e. in excess of several milliseconds and so the electrometer could be used to sense their presence many times during this period. Alternatively, when the bias $V_b$ which separates the electron-hole pairs, is removed, the electron-hole pair will recombine emitting a photon thus, with a suitable choice of cavity, to control the omission direction, this may be used to receive information represented by the incident photon, absorb it for a period of time and then optically transmit the information onwards.

Different deposition techniques may be used to grow the silicon-based layer structure including plasma-assisted CVD. Other precursor gases may be used. For example, dichlorosilane may be used as an alternative to silane. Different doping feed gases may also be used. For example, phosphine may be used in the place of arsine. Furthermore, doping concentrations may be altered to improve the the performance of the Peltier device.

Different dry etching technologies and chemistries may be used to define the silicon device. Techniques that produce high-density plasmas may be used including electron cyclotron resonance etching, inductively coupled plasma etching and helicon plasma etching. Furthermore, multilayers of materials may be etched using a succession of different etches. Other halogen-based chemistries may also be used, including $SiCl_4$, $CHF_3$, $Cl_2$, $F_2$, $CFCl_3$, $BCl_3$ and $SF_6$. Silicon dioxide may be etched using buffered HF solution or an isotropic, dry etch that is selective over silicon, for instance $CHEF_3$.

Other ohmic metals may be used for instance metal silicides.

The photo-absorption layer 1 may be configured to improve the efficiency of photon absorption and generation of electron-hole pairs. For example, amorphous silicon may be used or silicon may be doped with Erbium. In another example, silicongermanium quantum wells may also be used.

In order to reduce leakage between the heavily doped p- and n-type layers used for the Peltier device, these layers may be separated by a layer of $Si_3N_4$.

What is claimed is:

1. A photo-detector comprising a photo-absorptive region to absorb incident photons and produce charge carriers of opposite polarity in response thereto, first and second electrometers responsive to individual ones of the charge carriers of opposite polarity respectively to provide corresponding electrical outputs, and a comparator responsive to the outputs of the electrometers to provide an electrical detector output corresponding to the incident photons.

2. A detector according to claim 1 including a bias electrode to apply a bias field to the photo-absorptive region to separate charge carriers of opposite polarity produced by said incident photons towards the first and second electrometers respectively.

3. A detector according to claim 1 wherein the electrometers comprise single electron transistors.

4. A detector according to claim 1 wherein each said electrometer includes a source-drain path along which charge carrier transport is limited by Coulomb blockade, such that charge carriers of one of said polarities produced by said incident photons modify conduction characteristics of the source-drain path.

5. A detector according to claim 1 including an electrically driven cooling device to cool the electrometer.

6. A detector according to claim 5 wherein the cooling device comprises a Peltier effect device.

7. A detector according to claim 1 including a substrate that has a main body portion and a cantilever extending from the main body portion, said photo-absorptive region and said electrometers being disposed in the cantilever.

8. A detector according to claim 1 wherein each said electrometer comprises elongate source and drain electrodes coupled to opposite ends of the source drain path, and a gate electrode to apply a field to the source-drain path, the passage of charge carriers along the source-drain path being limited by Coulomb blockade, wherein the charge carriers of opposite polarities induced by the photons individually acting on the source-drain paths to alter their blockade characteristics.

9. A detector according to claim 8 including an electrode structure to apply a bias voltage between electrodes of the electrometers so as to apply an electrical field to the photo-absorptive region to separate the photo-induced charge carriers of opposite polarity.

10. A detector according to claim 1 wherein the photo-absorptive region is made of semiconductor material.

11. A detector according to claim 10 wherein the semiconductor material comprises silicon.

12. A detector according to claim 10 wherein the semiconductor material comprises a binary semiconductor.

13. A detector according to claim 10 wherein the semiconductor material comprises a ternary semiconductor.

14. A detector according to claim 10 wherein the semiconductor material comprises gallium arsenide.

15. A detector according to claim 1 wherein the photo-absorptive region is a gas.

16. A detector according to claim 1 including a waveguide for directing optical radiation into the photo-absorptive region.

17. A photo-detector comprising a photo-absorptive region to absorb incident photons and produce charge carriers in response thereto, and an electrometer responsive to individual ones of the charge carriers to provide a corresponding electrical output, and an electrically driven cooling device to cool the electrometer.

18. A detector according to claim 17 wherein the cooling device comprises a Peltier effect device.

19. A detector according to claim 17 including a first and a second said electrometer configured to detect charge carriers of opposite polarity produced by the incident photons in the photo-absorptive region.

20. A photo-detector comprising a photo-absorptive region to absorb incident photons and produce charge carriers in response thereto, and an electrometer responsive to individual ones of the charge carriers to provide a corresponding electrical output and a substrate that has a main body portion and a cantilever extending from the main body portion, said photo-absorptive region and said electrometer being disposed in the cantilever.

21. A detector according to claim 20 including a first and a second said electrometer configured to detect charge carriers of opposite polarity produced by the incident photons in the photo-absorptive region.

22. A detector according to claim 21 including a comparator to compare the current flowing in the source-drain paths of the electrometers.

23. A detector according to claim 21 wherein each said electrometer comprises elongate source and drain electrodes coupled to opposite ends of the source drain path, and a gate electrode to apply a field to the source-drain path, the passage of charge carriers along the source-drain path being limited by Coulomb blockade, wherein the charge carriers of opposite polarities induced by the photons individually acting on the source-drain paths to alter their blockade characteristics.

24. A detector according to claim 23 including means for applying a bias voltage between electrodes of the electrometers so as to apply a field to the photoabsorptive region to separate the photo-induced charge carriers of opposite polarity.

* * * * *